(12) United States Patent
Murata

(10) Patent No.: US 7,686,176 B2
(45) Date of Patent: Mar. 30, 2010

(54) SUSPENDED TYPE TRANSPORTING CARRIAGE AND TRANSPORTING SYSTEM

(75) Inventor: Masanao Murata, Ise (JP)

(73) Assignee: Muratec Automation Co., Ltd., Kyoto-shi (JP)

( * ) Notice: Subject to any disclaimer, the term of this patent is extended or adjusted under 35 U.S.C. 154(b) by 30 days.

(21) Appl. No.: 12/045,060

(22) Filed: Mar. 10, 2008

(65) Prior Publication Data
US 2008/0217278 A1    Sep. 11, 2008

(30) Foreign Application Priority Data
Mar. 9, 2007    (JP) .............................. 2007-060512

(51) Int. Cl.
*B66C 19/00*    (2006.01)
(52) U.S. Cl. ..................... 212/332; 414/280; 414/940
(58) Field of Classification Search ................. 212/332; 414/280, 940
See application file for complete search history.

(56) References Cited

U.S. PATENT DOCUMENTS

| | | | | |
|---|---|---|---|---|
| 2,102,995 A | * | 12/1937 | Coombs | ...................... 414/268 |
| 3,743,115 A | * | 7/1973 | Saul et al. | .................... 414/286 |
| 3,750,804 A | * | 8/1973 | Lemelson | .................... 414/276 |
| 3,786,942 A | * | 1/1974 | Dane, Jr. | ...................... 414/266 |
| 4,113,119 A | * | 9/1978 | Brown et al. | ................. 414/281 |
| 4,265,583 A | * | 5/1981 | Baird et al. | .................. 414/284 |
| 5,228,820 A | * | 7/1993 | Stansfield et al. | ........... 414/278 |
| 5,829,942 A | * | 11/1998 | Beers | ..................... 414/331.01 |
| 6,726,429 B2 | * | 4/2004 | Sackett et al. | ............... 414/217 |
| 6,848,882 B2 | * | 2/2005 | Tseng et al. | ................. 414/626 |
| 7,090,457 B2 | * | 8/2006 | Martin | ........................ 414/277 |

FOREIGN PATENT DOCUMENTS

| | | |
|---|---|---|
| EP | 1 369 179 A2 * | 12/2003 |
| JP | 2005-150129 | 6/2005 |
| JP | 2005-206371 | 8/2005 |
| JP | 2005-530361 | 10/2005 |
| WO | 2004-001582 | 12/2003 |

* cited by examiner

*Primary Examiner*—Thomas J. Brahan
(74) *Attorney, Agent, or Firm*—Young & Thompson

(57) ABSTRACT

A suspended type transporting carriage (16) is provided with: a gripping mechanism (22) for gripping a transported object (17); a hoisting mechanism (21) for hoisting the gripping mechanism; and a traveling mechanism (60), on which the hoisting mechanism is mounted in a suspended condition, for traveling on a rail (20) installed on or near a ceiling. The gripping mechanism is provided with (i) an elongating and contracting device (23) capable of horizontally elongating and contracting and (ii) a gripping device (24) disposed at a tip portion of the elongating and contracting device for selectively gripping the transported object.

6 Claims, 7 Drawing Sheets

SUSPENDED TYPE TRANSPORTING CARRIAGE AND TRANSPORTING SYSTEM

BACKGROUND OF THE INVENTION

1. Field of the Invention

The present invention relates to a suspended type transporting carriages such as an OHT (Overhead Hoist Transport) carriage, which is used in a manufacturing factory of a semiconductor device, an LCD (Liquid Crystal Display) device and the like and which travels on a track installed on or near the ceiling of the factory and transports the object, as well as a transporting system using such a carriage.

2. Description of the Related Art

In a manufacturing factory of a semiconductor device, an LCD device and the like, in order to deal with an increase of production amount, an improvement in production efficiency is strongly desired, as one of which it is desired to shorten the transporting time duration. In order to shorten the transporting time duration, it becomes an important point how to shorten the time duration required to transfer a carrier (i.e., a transported object) to a stocker or stacker device, which is a temporarily storage place for the carrier, from the carriage, how to shorten the time duration required to transfer the carrier to the carriage from the stocker, and so on. Here, the "carrier" or "transported object" in the present invention means a product, an intermediate product, a part, an article, a work, a partly-finished good, a good or the like (e.g, a semiconductor or LCD device), or means a box or container for containing such a product or the like (e.g, a container containing the semiconductor or LCD device), which has been transported or is to be transported by the transporting carriage.

For example, the semiconductor integrated circuit element, which is manufactured by the semiconductor manufacturing factory, is transported by the transporting system, while various processes such as thin film formation by CVD (Chemical Vapor Deposition), ion injection, photo-lithography, etching, inspection and so forth peculiar to the semiconductor manufacturing processes, are applied to the circuit element by various processing devices so that the final product is produced. In these processes, a plurality of semiconductor substrates are stored in a container, which is so called as a "FOUP (Front-Opening Unified Pod)" The semiconductor substrates in the container are transported between the processing devices by the transporting carriage, and are subjected to the respective peculiar processes by the respective processing devices. However, the processing time durations required for the respective processes are different between the processing devices. Thus, the waiting time duration until the next process is applied to the semiconductor substrates, whose duration or length is unknown, is normally generated for the semiconductor substrates. During this waiting time duration, by the transporting device, the FOUP containing the semiconductor substrates is once transported to, and is transferred (i.e., put) into a stocker or onto a simplified rack buffer from the carriage. When such a condition that the next process can be applied comes, the FOUP containing the semiconductor substrates is transferred (i.e., picked up) from the stocker or the simplified rack buffer to the carriage again, and is transported by the transporting system to the processing device for the next process. In case that the storage place for the FOUP is the simplified rack buffer disposed at the vicinity of the respective processing devices, the transferring operations (i.e., putting and/or picking-up operations) take a short time. On the other hand, in case that the storage place for the FOUP is the stocker which is disposed distant from the processing device, the putting and/or picking up operations take a long time. Therefore, to more often employ the simplified rack buffer instead of the stocker is effective for shortening the transporting time duration. By shorting the time duration required to put and/or pick up the FOUP, the improvement in the production efficiency is expected.

Japanese Patent Application Publication Laid Open No. 2005-150129 discloses such a simplified rack buffer disposed at the vicinity of the processing device. In this case, the transferring operations to and from the simplified rack buffer can be easily performed by a hoisting belt, which is disposed on the transporting carriage, and a sliding rack plate, which is slidable in a horizontal direction. The sliding rack plate allows the movement of the FOUP toward the transporting carriage.

Each of Japanese Patent Application Publication Laid Opens No. 2005-206371 and No. 2005-530361 discloses such a simplified rack buffer disposed at the vicinity of the processing device. In this case, the sliding rack plate is not used. Instead, the hoisting mechanism itself is slidable by virtue of the sliding mechanism. The hoisting mechanism is slid between the position right underneath the traveling rail and the lateral position of the traveling rail, so that the transporting carriage can directly access the port, which is lateral from the position right underneath the traveling rail.

SUMMARY OF THE INVENTION

The above described art disclosed in Japanese Patent Application Publication Laid Open No. 2005-150129 has such a problem that, since the driving mechanism including gears, a driving motor and so forth is required to each of the sliding rack plates, the cost of the rack device becomes essentially quite high. Further, a failure in just one sliding rack plate may cause the total failure of the rack device, which certainly degrades the reliability of the rack device.

The above described art disclosed in Japanese Patent Application Publication Laid Open No. 2005-206371 or No. 2005-530361 has such a problem that, although the transporting carriage can directly access respective one of a plurality of racks which are the same in height to each other, the transporting carriage cannot directly access the racks which are different in height from each other.

It is therefore an object of the present invention to provide a suspended type transporting carriage, which can directly transfer a transported object to and from racks, which are lateral to the transporting carriage and are at least partly different in height from each other, can reduce the cost and can improve the reliability, as well as a transporting system using such a carriage.

The above object of the present invention can be achieved by a suspended type transporting carriage comprising: a gripping mechanism for gripping a transported object; a hoisting mechanism for hoisting said gripping mechanism; and a traveling mechanism, on which said hoisting mechanism is mounted in a suspended condition, for traveling on a rail installed on or near a ceiling, said gripping mechanism comprising (i) an elongating and contracting device capable of horizontally elongating and contracting and (ii) a gripping device disposed at a tip portion of said elongating and contracting device for selectively gripping the transported object.

According to the suspended type transporting carriage of the present invention, in operation, in order to transfer the transported object such as a FOUP or the like with respect to one rack plate of one rack device, the transporting carriage travels to and stops at a position corresponding to this one rack device by the traveling mechanism. Then, the gripping mechanism is moved down by the hoisting mechanism. Then, the elongating and contracting device, such as a sliding plate, is horizontally sent out while the gripping device at the tip portion grips or can grip the transported object. Accordingly, it is possible to transfer (i.e., put or pick up) the transported object with respect to a position, which is laterally away from the right beneath of the transporting carriage.

In one aspect of the suspended type transporting carriage of the present invention, said gripping mechanism further comprises a main body, which is hoisted by said hoisting mechanism, and said elongating and contracting device is capable of horizontally elongating and contracting with respect to said main body.

According to this aspect, the gripping device can be certainly elongated toward the rack device from the main body, and certainly contracted away from the rack device to the main body, by virtue of the elongating and contracting device.

In another aspect of the suspended type transporting carriage of the present invention, the suspended type transporting carriage further comprises an attitude keeping device, which detachably fixes one portion of said gripping mechanism and one portion of rack plates of a rack device to each other, for keeping or stabilizing an attitude of said gripping mechanism with respect to said rack device.

According to this aspect, upon transferring the transported object, the attitude, posture or balance of the gripping mechanism can be kept or stabilized by virtue of the attitude keeping device, as it fixes the gripping mechanism and the rack device to each other.

The above object of the present invention can be achieved by a transporting system comprising (I) the above describe suspended type transporting carriage of the present invention and (II) a rack device having a plurality of rack plates, which are vertically arranged at different heights from each other, for temporarily storing the transported object.

According to the transporting system of the present invention, since it is provided with the above describe suspended type transporting carriage of the present invention, it is possible to transfer the transported object with respect to a position, which is laterally away from the right beneath of the transporting carriage. Further, since it is not necessary to equip a sliding mechanism to each rack plates, the total number of parts or components constituting the elongating and contracting device (or the sliding mechanism or the like) can be certainly diminished. Also, it is not necessary to equip a driving mechanism to each rack plates. Thus, the increase of the cost can be avoided. In addition, it is possible to avoid such a case that a failure of just one of a plurality of sliding mechanism leads to the total failure or the total adverse affect of the transporting system, since the sliding mechanism does not exist in each of the rack plates.

In this manner, according to the present invention, since it is not necessary to equip the elongating and contracting device (or the sliding plate or the like) to each of the rack plates but since it is enough to equip the elongating and contracting device to the side of the transporting carriage, it is possible to reduce the cost and increase the reliability.

In one aspect of the transporting system of the present invention, the transporting system further comprises an attitude keeping device, which detachably fixes one portion of said gripping mechanism and one portion of said rack plates to each other, for keeping or stabilizing an attitude of said gripping mechanism with respect to said rack device.

According to this aspect, even in such a case that the elongating and contracting device elongates by more distance to a rack plate, which is relatively distant from the position right beneath the transporting carriage, so as to transfer the transported object with respect to this rack plate, or in such a case that a heavier transported object is gripped while the elongating and contracting device elongates, it is still possible to keep the attitude of the gripping mechanism and thereby transfer the transported object in stable.

In the above mentioned aspect comprising the attitude keeping device, said attitude keeping device may comprise a rod portion on said gripping mechanism and a latch portion on said rack plates, so that said rod portion can be engaged with said latch portion.

By constructing in this manner, when the elongating and contracting device elongates, the rod portion is engaged with the latch portion. The rod portion may enter upside or downside of the rack plate. Thus, it is possible to easily fix the gripping mechanism with respect to the rack device, and thereby keep the attitude of the gripping mechanism. Also, by equipping the latch portion to respective one of the rack plates, it is possible to fix the gripping mechanism upon transferring the transported object with respect to any one of the rack plates.

In the above mentioned aspect comprising the attitude keeping device, in case that the transported object is transferred between said gripping mechanism and one plate of said rack plates, said rod portion may be engaged with said latch portion of another plate of said rack plates, said another plate being right above said one plate.

By constructing in this manner, the rod portion is engaged with the latch portion of another rack plate right above one rack plate with respect to which the transported object is transferred. Thus, the forward space of the one rack plate, with respect to which the transported object is transferred, is wide open. Namely, it is possible to avoid the movement of the elongating and contracting device from being interfered by the attitude keeping device. Accordingly, it is possible to easily perform the transferring operation while surely keeping the attitude.

In the above mentioned aspect comprising the attitude keeping device, said rod portion may be capable of elongating or rotating with respect to said gripping mechanism toward said latch portion, so that a tip of said rod portion can be engaged with the latch portion after said rod portion is elongated or rotated in a predetermined direction.

By constructing in this manner, by horizontally elongating or semi-circularly rotating the rod portion, it is possible to easily and surely engage the rod portion with the latch portion.

As describe above in detail, according to the suspended type transporting carriage and the transporting system of the present invention, it is not necessary to equip the sliding mechanism to each of the rack plates. It is possible to access to a desirable rack plate and perform the transferring operation thereat. Accordingly, it is possible to reduce the total cost as for the whole system while improving the reliability of the whole system.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

Figure 1:
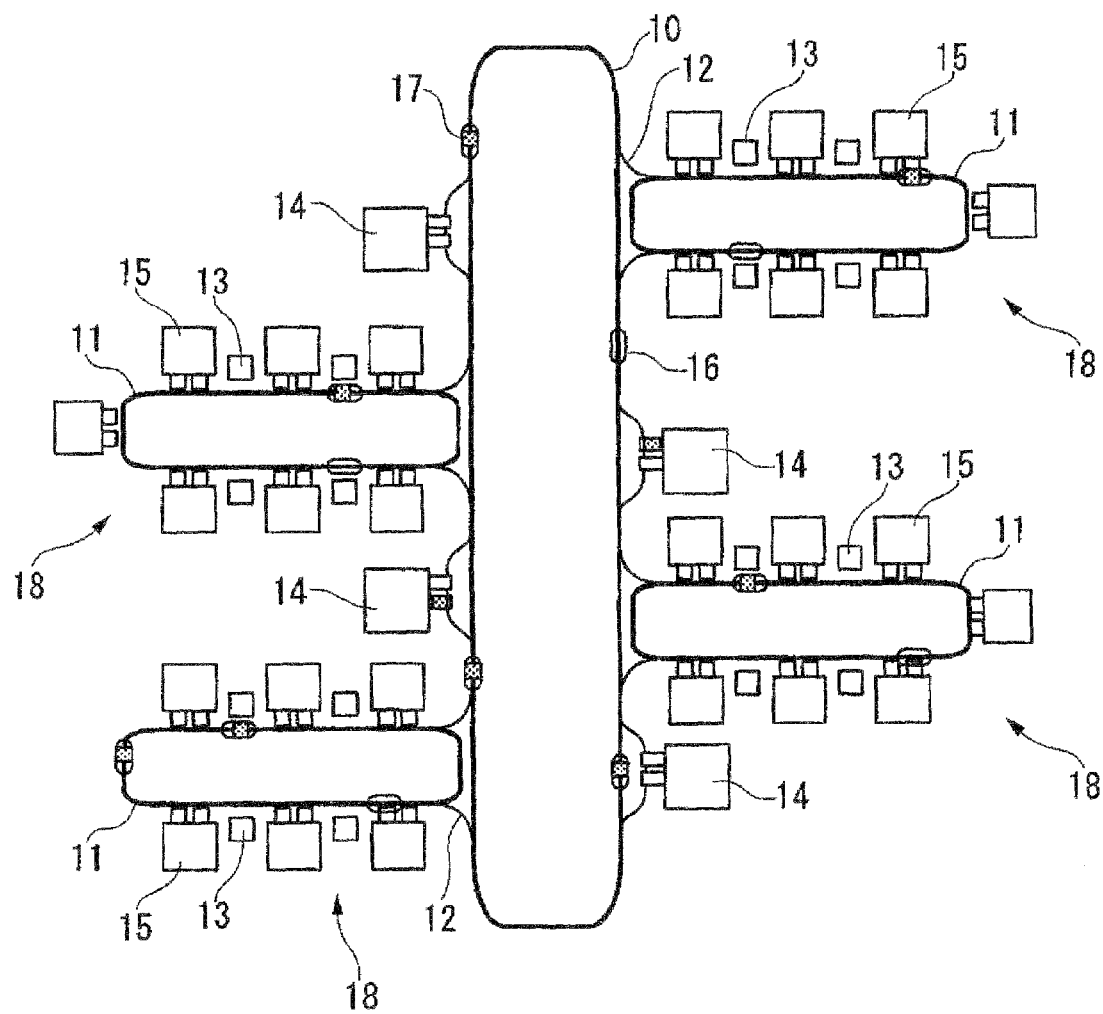
FIG. 1 is a schematic plan view of a semiconductor manufacturing facility, in which a transporting system having a transporting carriage and a rack device as an embodiment of the present invention is used.

At first, an overall structure of a transporting system as an embodiment of the present invention is explained with referring to FIG. 1. FIG. 1 shows a semiconductor manufacturing facility, in which the transporting system having a transporting carriage as the embodiment is used.

In FIG. 1, the transporting system is used for transporting the transported object by the transporting carriage in-between one process or between a plurality of processes, so that various processes are sequentially applied to the transported object, as in a semiconductor manufacturing factory, and a final product is completed. The semiconductor manufacturing facility is constructed such that a plurality of processing portions 18 are arranged. Each of the processing portions 18 is provided with: one or plurality of rack devices 13; and a plurality of processing devices 15 whose processes are different from each other. The rack device 13 and the processing devices 15 in respective one of the processing portions 18 are connected to an inter-process track 10 through an intra-process track 11 and a diverged track 12.

As shown in FIG. 1, the transporting system has such a structure that a plurality of transporting carriages 16 travel on traveling paths comprising the inter-process track 10, the intra-process tracks 11 and the diverged tracks 12. The traveling paths are disposed above (i.e., on the side of the ceiling of) the semiconductor manufacturing factory. A FOUP (Front Opening Unified Pod) 17 is hoisted to be suspended by the transporting carriage 16 and is transported. Here, the FOUP 17 is a container for contain a plurality of semiconductor substrates. The FOUP 17 has a substantially rectangular parallelepiped shape. On a center of an upper surface of the FOUP 17, a flange 27 is equipped so as to be gripped and transported. The semiconductor substrates are contained in the FOUP 17 and are transported, so that various processes such as thin film formation by CVD, ion injection, photolithography, etching, inspection and so forth are applied by various processing devices. A stocker (or stacker) 14 is disposed so as to be connected to the inter-process track 10, and plays a role of storing the FOUP 17 during a waiting time duration for each process, as a storing device for storing a plurality of FOUPs 17.

Figure 2:
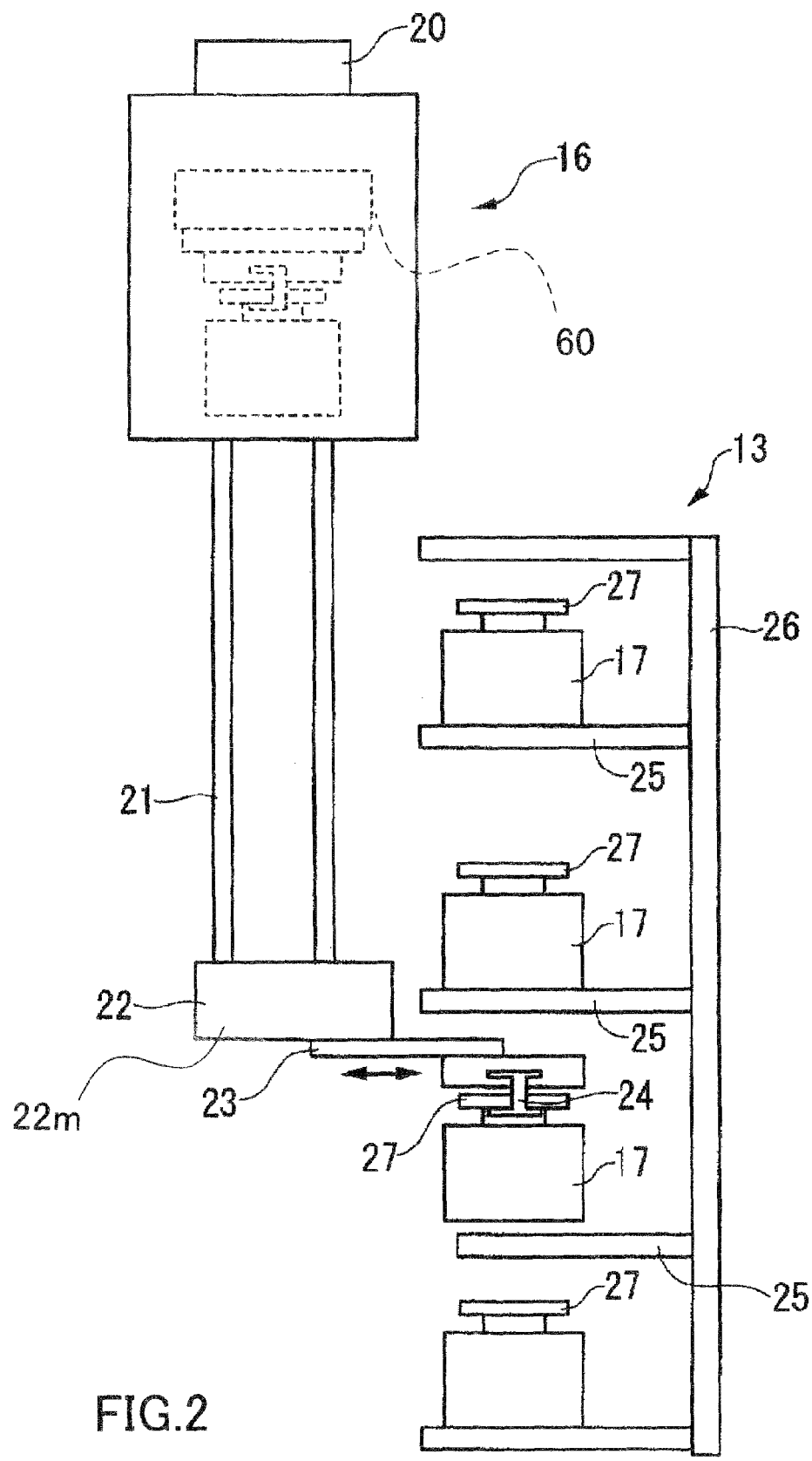
FIG. 2 is a side view of the transporting carriage and the rack device in such a condition that the transporting carriage transfers the transported object with respect to a desired position of the rack device in one embodiment.

Next, the transporting carriage 16 and the rack device 13 in one embodiment will be explained with referring to FIG. 2 with FIG. 1. FIG. 2 shows the transporting carriage 16 and the rack device 13 in such a condition that the transporting carriage 16 transfers the FOUP 17 with respect to a desired position of the rack device 13 in one embodiment.

As shown in FIG. 2, the transporting carriage 16 is adapted to travel on a rail 20 of the traveling path, by a traveling mechanism 60 having a linear motor for example (not-illustrated) and moves to a position of destination. The transporting carriage 16 is provided with a hoisting belt 21 and a gripping mechanism 22.

One transporting carriage 16 has four hoisting belts 21, which are wound around reels housed in the transporting carriage 16. The gripping mechanism 22 is suspended by four hoisting belts 21 at the tip portions thereof. The gripping mechanism 22 is moved up and down through the hoisting belts 21 by the forward and reverse rotations of the reels by virtue of the driving mechanism such as a motor etc., which is not illustrated. Each of the hoisting belts 21 has such a length that the gripping mechanism 22 can move the FOUP 17 in the up and down direction, until the height of a fixed rack plate 25, which is positioned at the lowest, among a plurality of fixed rack plates 25 of the rack device 13.

The gripping mechanism 22 is provided with a sliding mechanism 23 and a gripper 24. The sliding mechanism 23, which constitutes one example of "the elongating and contracting device" of the present invention, is adapted to be elongated and contracted in a horizontal direction by a ball screw driving mechanism, which is not illustrated, with respect to a main body 22m of the gripping mechanism 22. The gripper 24, which is adapted to grip the flange 27 of the FOUP 17, is attached to a bottom portion of the sliding mechanism 23. The gripper 24 has an open and close capability of gripping the flange 27 of the FOUP 17 and is constructed to grip the flange 27 when the sliding mechanism 23 is elongated to be at a position right above the FOUP 17.

As shown in FIG. 2, the rack device 13 is provided with a brace member or members 26 and a plurality of fixed rack plates 25 arranged in the vertical direction with intervals. The processes by the processing devices 15 are different in their contents from each other, so that their processing time durations are also different from each other. Accordingly, an indefinite waiting time duration is generated until the next process is applied. Although the stocker 14 may store the FOUP 14 during the waiting time duration, the stocker 14 has such a drawback that the stocker 14 cannot speedily deal, since the stocker 14 is distant from the processing device 15 and it takes a certain time period for the stocker 14 to load and unload the FOUP 17. Therefore, the rack device 13 is disposed at the vicinity of the processing device 15 as a simplified storing place for the FOUP 17 during the waiting time duration.

Here, the principle of carrying in (i.e., loading) and carrying out (i.e., unloading) the FOUP 17 with respect to the rack device 13 by the transporting carriage 16 is explained with referring to FIG. 2.

The carrying out operation of the FOUP 17 is as following. Namely, the transporting carriage 16, which has traveled on the inter-process track 11 and has stopped at the position opposed to the rack device 13, winds out the hoisting belt 21 by rotating the reel by virtue of the motor or the like. By this, the transporting carriage 16 moves the gripping mechanism 22, which does not grip the FOUP 17, down to the position at a predetermined height. After the gripping mechanism 22 is moved down to the target position of one of the fixed rack plates 25, the sliding mechanism 23 is elongated or expanded, so that the sliding mechanism 23 is entered to the position right above one of the FOUPs 17 within the rack device 13, where the flange 27f the FOUP 17 is gripped by the gripper 24. After the FOUP 17 is gripped, the sliding mechanism 23 is contracted or shrunk. Successively, the hoisting belt 21 is wound up by rotating the reel, so that the FOUP 17 is moved up together with the gripping mechanism 22. After that, the transporting carriage 16 travels on the inter-process track 11 toward a next transportation destination of the FOUP 17.

In case that the transporting carriage 16 puts the FOUP 17 onto the rack device 13, the putting (i.e., carrying in) operation of the FOUP 17 can be performed in the reverse order of the above described carrying out operation. Namely, the transporting carriage 16, which is gripping the FOUP 17 by the gripper 24 and has traveled on the inter-process track 11, stops at the position opposed to the rack device 13, onto which the FOUP 16 is to be put. Next, the transporting carriage 16 winds out the hoisting belt 21 by rotating the reel by virtue of the motor or the like. By this, the transporting carriage 16 moves the gripping mechanism 22, which is gripping the FOUP 17, down to the position at the height of the fixed rack plate 25, onto which the FOUP 17 is to be put. After that, the sliding mechanism 23 is elongated or expanded, so that the FOUP 17 is moved to the position right above the fixed rack plate 25, where the FOUP 17 is put onto the rack device 13 by releasing the gripper 24.

Figure 3:
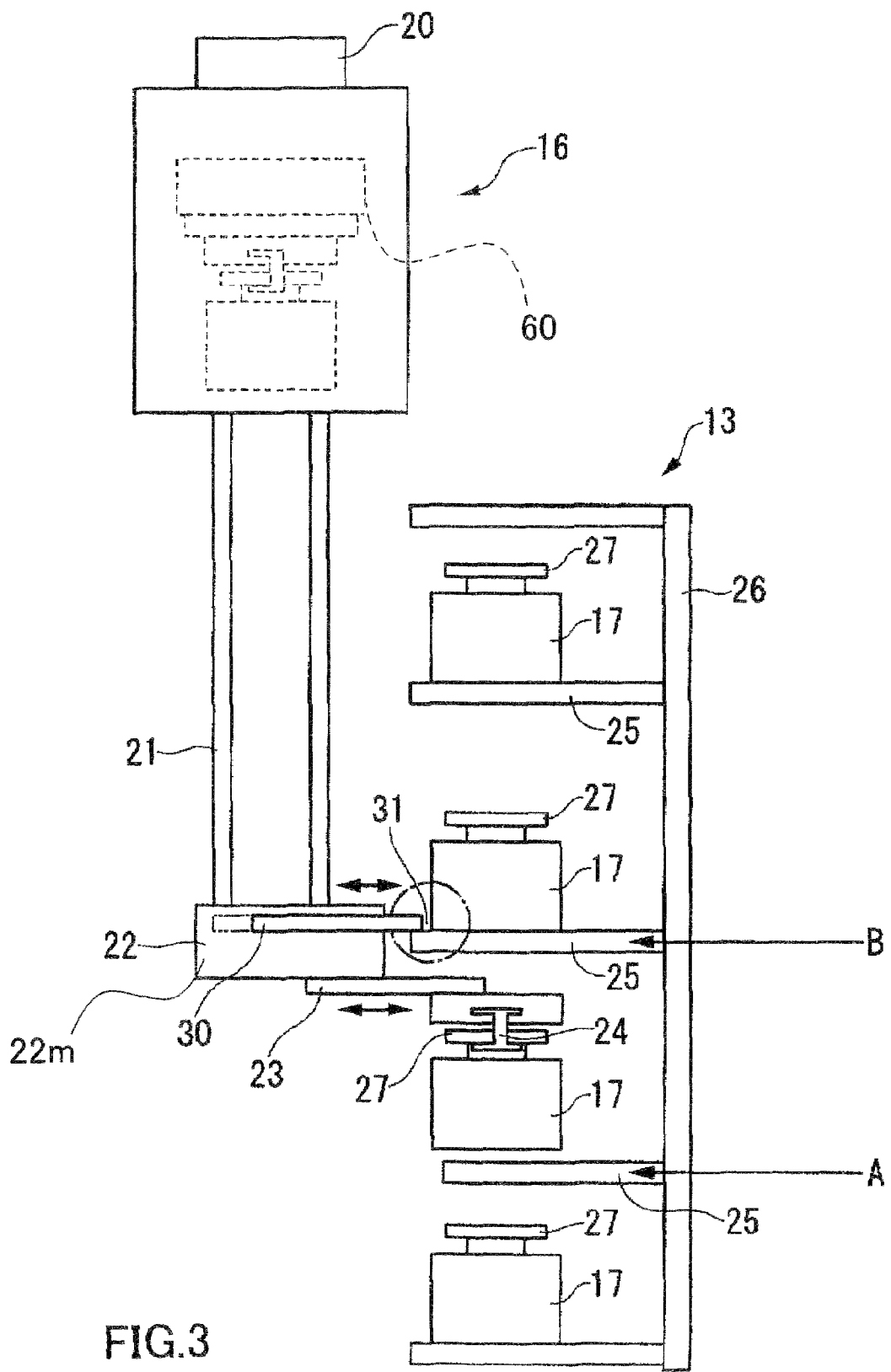
FIG. 3 is a side view of a transporting carriage and the rack device in such a condition that the transporting carriage transfers the transported object with respect to a desired position of the rack device in another embodiment.

Next, the transporting carriage 16 and the rack device 13 in another embodiment will be explained with referring to FIG. 3 with FIG. 1. FIG. 3 shows the transporting carriage 16 and the rack device 13 in such a condition that the transporting carriage 16 transfers the FOUP 17 with respect to a desired position of the rack device 13 in another embodiment.

The above explanation is the principle of transferring (i.e., carrying-in and carrying-out) the FOUP 17 with respect to the rack device 13. Upon transferring, there may be a case that the FOUP 17 is transferred to the rack device 13, which is distant from the position right under the transporting carriage 16, or a case that a heavier FOUP is transported to the rack device 13. Namely, the transporting system in another embodiment is provided with the "attitude keeping device" as described below, in order to realize a stabilized transferring operation, even in such a case that the sliding mechanism 23 is elongated to a more distant position or such a case that a heavier FOUP is gripped when the sliding mechanism 23 is expanded.

In FIG. 3, the transporting system in the present embodiment is provided with the attitude (i.e., posture or balance) keeping device, which is different from the transporting system of the embodiment shown in FIG. 2. The attitude keeping device is provided with: a rod 30 disposed to the gripping mechanism 22; and a latch portion 31 disposed to the fixed rack plate 25. The rod 30 is disposed to the upper portion of the gripping mechanism 22, so that the rod 30 is engaged with the latch portion 31 of the fixed rack plate 25, which is disposed just above the fixed rack plate 25 of the transferring target, when the sliding mechanism 23 is elongated. Thus, the attitude keeping is enabled by fixing the transporting carriage 16 to the rack device 13.

Hereinbelow, the attitude keeping operation of the gripping mechanism 22, which is gripping the FOUP 17, by virtue of the attitude keeping device is explained with referring to FIG. 3.

In FIG. 3, the transporting carriage 16 stops at the position opposed to the rack device 13, moves the gripping mechanism 22, which is gripping the FOUP 17, down to the position at the position A of the fixed rack plate 25, onto which the FOUP 17 is to be put. After that, the sliding mechanism 23 is elongated, and the rod 30 is sent out toward the rack device 13. At this time, the rod 30 is engaged with the latch portion 31 of the fixed rack plate 25 at a position B, which is just above the fixed rack plate 25 at the position A of the transferring target. By this, the gripping mechanism 22 is stabilized (i.e., the attitude, posture or balance of the gripping mechanism 22 is kept), and it is possible to transfer the FOUP 17 in stable, even in such a case that the sliding mechanism 23 is elongated to a more distant position or such a case that a heavier FOUP 17 is gripped when the sliding mechanism 23 is expanded.

Next, various examples of the "attitude keeping device" having the rod and the latch portion of the present embodiment will be explained with referring to FIG. 4A to FIG. 8B. Each of FIGS. 4A, 5A, 6A, 7A and 8A is a perspective view of the attitude keeping device while each of FIGS. 4B, 5B, 6B, 7B and 8B is a corresponding side view, respectively.

Figure 4A:
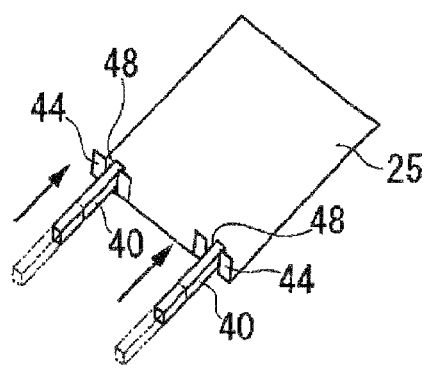
FIG. 4A is a perspective view of one example of an attitude (i.e., posture) keeping device for the rack device in the present embodiment.
Figure 4B:
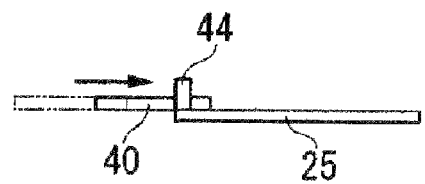
FIG. 4B is a side view of the attitude keeping device in FIG. 4A.

In FIGS. 4A and 4B, the attitude keeping device is provided with a set of protruding rods 40 and a set of rod bearings 44. Each of the protruding rods 40 has a rod member. Each of the rod bearings 44 has a rod member in each of which a concave portion 48 is vertically formed at the edge portion of the fixed rack plate 25 on the side where the gripping mechanism 22 is entered. When the sliding mechanism 23 is elongated, each of the protruding rods 30 horizontally protrudes from a position indicated by a chain double-dashed line to a position indicated by a solid line in FIGS. 4A and 4B. As the protruding rods 40 are engaged with the rod bearings 44, the gripping mechanism 22 is stabilized or fixed to the rack device 13.

Figure 5A:
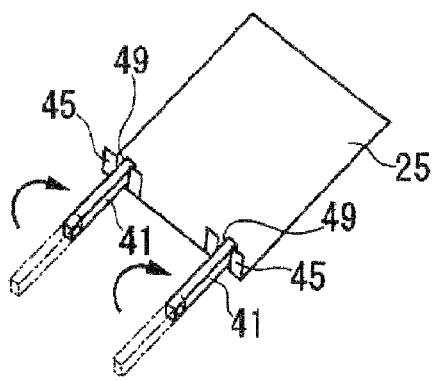
FIG. 5A is a perspective view of another example of an attitude keeping device for the rack device in the present embodiment.
Figure 5B:
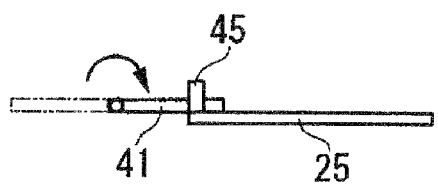
FIG. 5B is a side view of the attitude keeping device in FIG. 5A.

In FIGS. 5A and 5B, the attitude keeping device is provided with a set of rotational rods 41 and a set of rod bearings 45 to latch or lock the rotational rods 41. Each of the rod bearings 45 has a rod member in each of which a concave portion 49 is vertically formed at the edge portion of the fixed rack plate 25 on the side where the gripping mechanism 22 is entered, as in the case of the rod bearings 44 shown in FIGS. 4A and 4B. On the other hand, each of the rotational rods 41 has a rod member (as in the case of the protruding rods 40 shown in FIGS. 4A and 4B), which is rotatably fixed on the gripping mechanism 22 at one end thereof and is to caracole in a semicircular shape. This is contrast to the protruding rods 40 which is to horizontally protrude. Namely, each of the rotational rods 41 draws a semicircle with the end, which is rotatably fixed to the gripping mechanism 22, as the fulcrum point, to move from a position indicated by a chain double-dashed line to a position indicated by a solid line in FIGS. 5A and 5B. As the rotational rods 41 are engaged with the rod bearings 45, the gripping mechanism 22 is stabilized or fixed to the rack device 13.

Figure 6A:
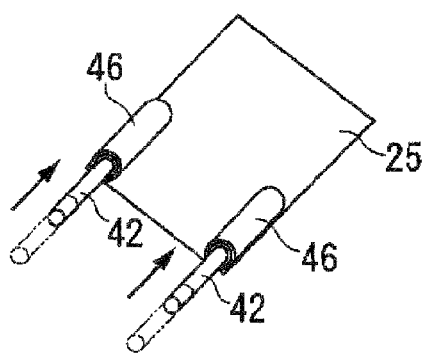
FIG. 6A is a perspective view of another example of an attitude keeping device for the rack device in the present embodiment.
Figure 6B:
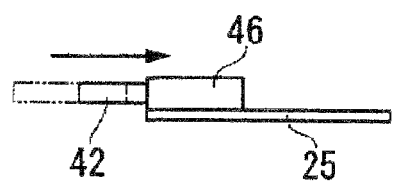
FIG. 6B is a side view of the attitude keeping device in FIG. 6A.

In FIGS. 6A and 6B, the attitude keeping device is provided with a set of inserting rods 42 and a set of tube rod bearings 46. Each of the inserting rods 42 has a rod member in a circular cylinder shaped. Each of the tube rod bearings 46 has a tube member in which a hollow space is formed. As the slide mechanism 23 is elongated or expanded, each of the inserting rods 42 moves from a position indicated by a chain double-dashed line to a position indicated by a solid line in FIGS. 6A and 6B. As the tip portions of the inserting rods 42 are respectively inserted into the tube rod bearings 46, the gripping mechanism 22 is stabilized or fixed to the rack device 13.

Figure 7A:
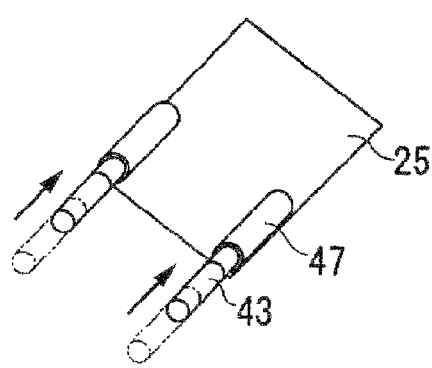
FIG. 7A is a perspective view of another example of an attitude keeping device for the rack device in the present embodiment.
Figure 7B:
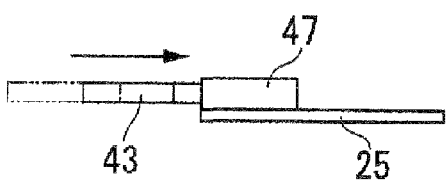
FIG. 7B is a side view of the attitude keeping device in FIG. 7A.

In FIGS. 7A and 7B, the attitude keeping device is provided with a set of absorbing or sucking rods 43 and a set of rod bearings 47. Each of the absorbing or sucking rods 43 has an electric magneto, sucker or the like at the tip portion thereof and each of the rod bearings 47 has a magnetic body, a smooth surface or the like at the edge or concave surface thereof, or vice versa. Accordingly, each of the absorbing or sucking rods is latched or locked to the tip portion of each of the absorbing or sucking rod 43.

Figure 8B:
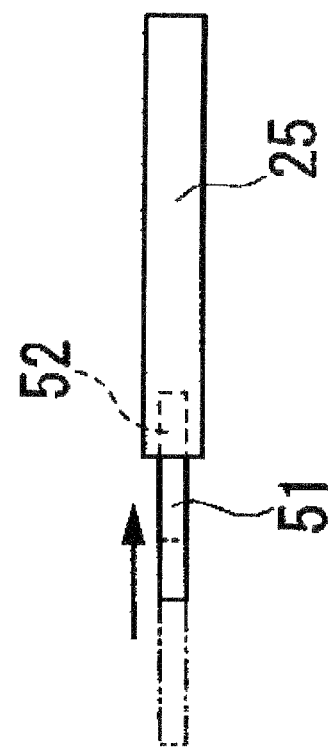
FIG. 8B is a side view of the attitude keeping device in FIG. 8A.
Figure 8A:
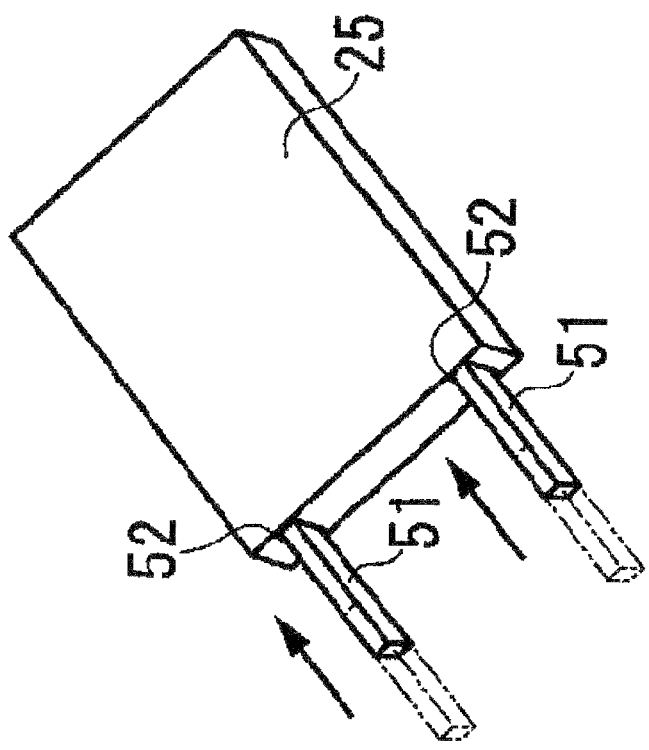
FIG. 8A is a perspective view of another example of an attitude keeping device for the rack device in the present embodiment.

In FIGS. 8A and 8B, in case that the fixed rack plate 25 is thick enough, a pair of inserting portions 52 may comprise a pair of holes 52, which are formed at the surface, where the gripping mechanism 22 is entered, i.e., at the surface facing to a pair of protruding rods 51, of the fixed rack plate 25.

Figure 9:
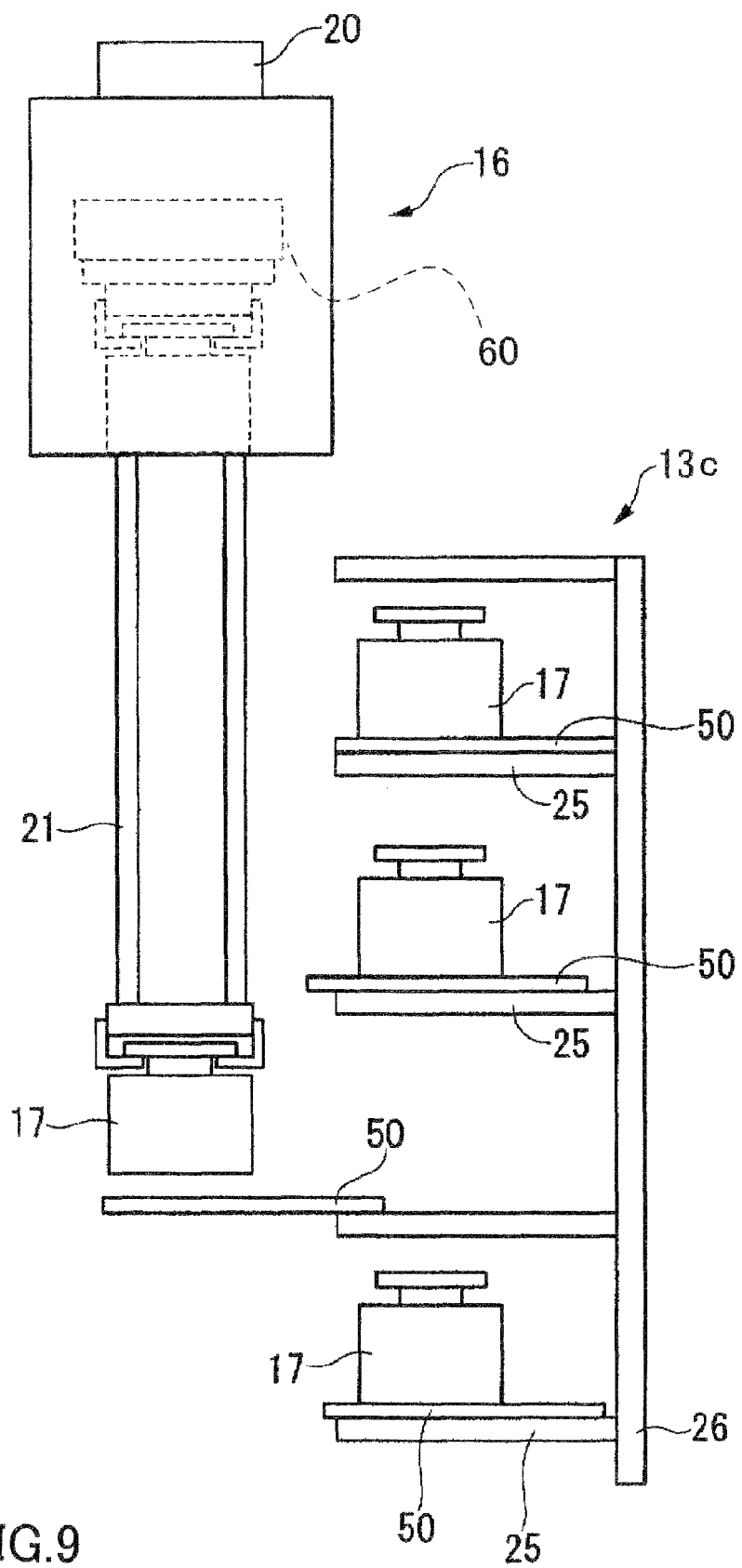
FIG. 9 is a side view of a transporting carriage and a rack device in one comparison example.
Figure 10:
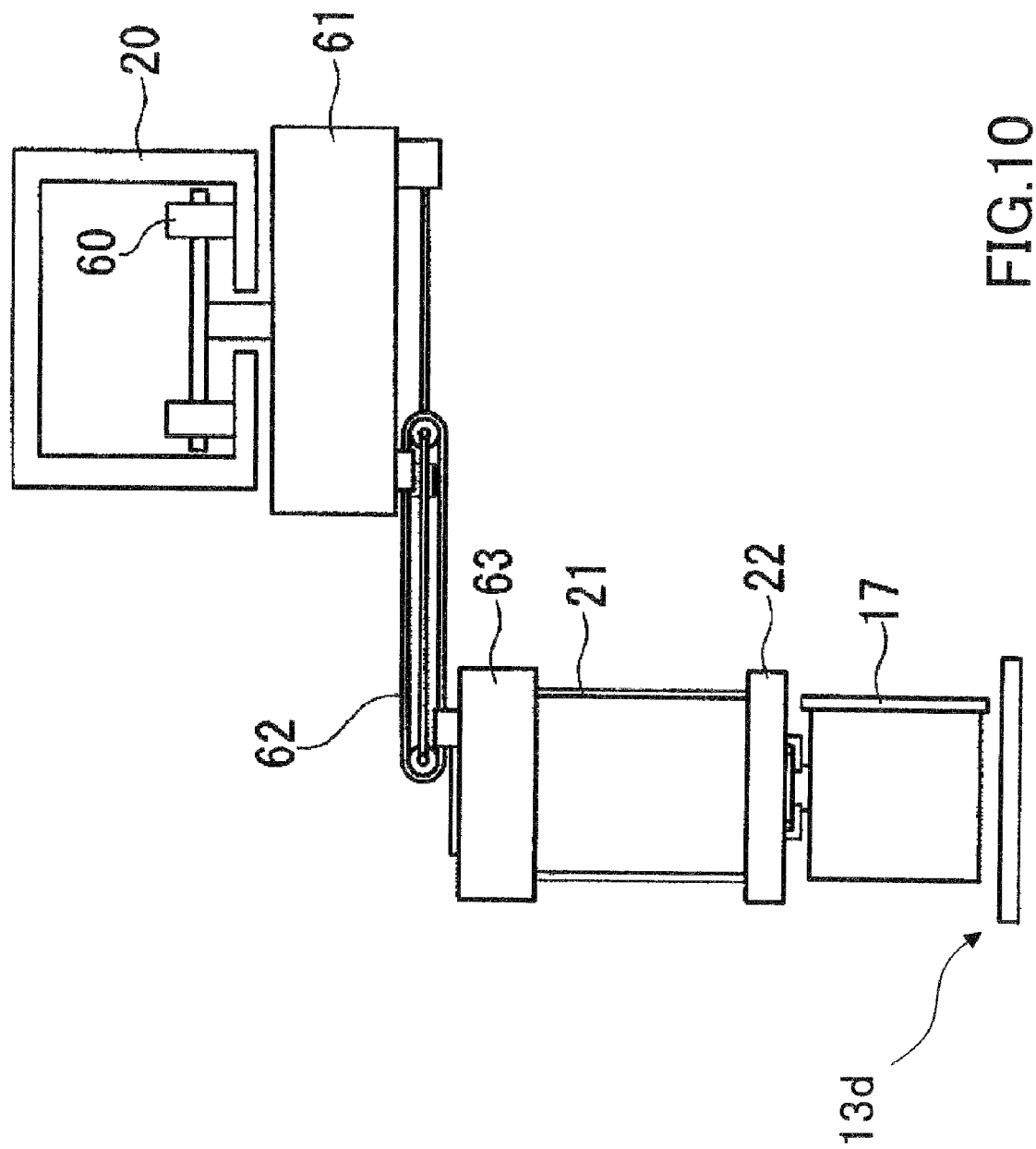
FIG. 10 is a side view of a transporting carriage and a rack buffer in another comparison example.

Next, comparison examples will be explained with referring to FIG. 9 and FIG. 10, in order to exhibit the advantageous features of the present embodiments. FIG. 9 and FIG. 10 show comparison examples, respectively.

In FIG. 9, a rack device 13c of the comparison example has a sliding rack plate 50, which is slidable on the fixed rack plate 25. In this case, the transferring operations to and from the rack device 13c can be easily performed by linking the movement of the hoisting belt 21 and the movement of the sliding rack plate 50.

However, in this comparison example of FIG. 9, since the driving mechanism including gears, a driving motor and so forth is required to each of the sliding rack plates 50, the cost of the rack device 13c becomes essentially quite high. Further, a failure in just one sliding rack plate 50 may cause the total failure of the rack device 13c, which certainly degrades the reliability of the rack device 13c. In contrast, the rack device 13 of the present embodiment has the great advantage of high reliability with relatively low cost since just one sliding mechanism 23 is required to perform the transferring operations and since the structure of the rack device 13 is relatively simple.

In FIG. 10, a rack buffer 13d of the comparison example is quite simple. In this case, the transporting carriage travels on the rail 20 by a traveling mechanism 60. A hoisting mechanism 63 of the transporting carriage is slid by a sliding mechanism 62 and is stopped and positioned by a positioning mechanism 61. The hoisting mechanism 63 is slid between the position right underneath the rail 20 and the lateral position of the rail 20, so that the gripping mechanism 22 can directly access the port of the rack buffer 13d.

However, in this comparison example of FIG. 10, the gripping mechanism 22 cannot directly access the racks which are different in height from each other. In contrast, the rack device 13 of the present embodiment has the great advantage that the gripping mechanism 22 can directly access one of the ports of the rack device 13, which are positioned at various heights.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2007-60512 filed on Mar. 9, 2007 including the specification, claims, drawings and summary is incorporated herein by reference in its entirety.

What is claimed is:

1. A suspended transporting carriage traveling on a rail installed on or near a ceiling of a semiconductor manufacturing factory and transporting a transported object in a suspended condition, comprising:
    a gripping mechanism for gripping said transported object;
    a hoisting mechanism for hoisting said gripping mechanism;
    a traveling mechanism, on which said hoisting mechanism is mounted in a suspended condition, for traveling on said rail,
    said gripping mechanism comprising (i) an elongating and contracting device capable of horizontally elongating and contracting and (ii) a gripping device disposed at a tip portion of said elongating and contracting device for selectively gripping the transported object; and
    an attitude keeping device, which detachably fixes one portion of said gripping mechanism and one portion of rack plates of a rack device to each other, for keeping or stabilizing an attitude of said gripping mechanism with respect to said rack device,
    said hoisting mechanism comprising a hoisting belt wound out to move down said gripping mechanism and wound up to move up said gripping mechanism,
    said transported object being a FOUP to contain a plurality of semiconductor substrates,
    said gripping device gripping the upper part of said FOUP,
    said attitude keeping device detachably fixing said gripping mechanism on said rack device, when said hoisting belt is wound out to move said gripping mechanism down to the position at a predetermined height and said transported object is put onto said rack device or said transported object is transferred between said gripping mechanism and said rack device.

2. The suspended type transporting carriage according to claim 1, wherein
    said gripping mechanism further comprises a main body, which is hoisted by said hoisting mechanism, and
    said elongating and contracting device is capable of horizontally elongating and contracting with respect to said main body.

3. A transporting system traveling on a rail installed on or near a ceiling of a semiconductor manufacturing factory and transporting a transported object in a suspended condition, comprising:
    (I) a suspended transporting carriage comprising:
    a gripping mechanism for gripping said transported object;
    a hoisting mechanism for hoisting said gripping mechanism; and
    a traveling mechanism, on which said hoisting mechanism is mounted in a suspended condition, for traveling on said rail,
    said gripping mechanism comprising (i) an elongating and contracting device capable of horizontally elongating and contracting and (ii) a gripping device disposed at a tip portion of said elongating and contracting device for selectively gripping the transported object,
    (II) a rack device having a plurality of rack plates, which are vertically arranged at different heights from each other, for temporarily storing the transported object, and
    (III) an attitude keeping device, which detachably fixes one portion of said gripping mechanism and one portion of said rack plates to each other, for keeping or stabilizing an attitude of said gripping mechanism with respect to said rack device, said hoisting mechanism comprising a hoisting belt wound out to move down said gripping mechanism and wound up to move up said gripping mechanism, said transported object being a FOUP to contain a plurality of semiconductor substrates, said gripping device gripping the upper part of said FOUP, said attitude keeping device detachably fixing said gripping mechanism on said rack device, when said hoisting belt is wound out to move said gripping mechanism down to the position at a predetermined height and said transported object is put onto said rack device or said transported object is transferred between said gripping mechanism and said rack device.

4. The transporting system according to claim 3, wherein said attitude keeping device comprises a rod portion on said gripping mechanism and a latch portion on said rack plates, so that said rod portion can be engaged with said latch portion.

5. The transporting system according to claim 4, wherein, in case that the transported object is transferred between said gripping mechanism and one plate of said rack plates, said rod portion is engaged with said latch portion of another plate of said rack plates, said another plate being right above said one plate.

6. The transporting system according to claim 4, wherein said rod portion is capable of elongating or rotating with respect to said gripping mechanism toward said latch portion, so that a tip of said rod portion can be engaged with the latch portion after said rod portion is elongated or rotated in a predetermined direction.

* * * * *